US006208618B1

(12) United States Patent
Kenney et al.

(10) Patent No.: US 6,208,618 B1
(45) Date of Patent: Mar. 27, 2001

(54) METHOD AND APPARATUS FOR REPLACING LOST PSTN DATA IN A PACKET NETWORK

(75) Inventors: John B. Kenney, Granger; Robert B. Magill, South Bend; R. Michael Schafer, Granger, all of IN (US)

(73) Assignee: Tellabs Operations, Inc., Lisle, IL (US)

( * ) Notice: Subject to any disclaimer, the term of this patent is extended or adjusted under 35 U.S.C. 154(b) by 0 days.

(21) Appl. No.: 09/206,191

(22) Filed: Dec. 4, 1998

(51) Int. Cl.[7] .............................. H04J 3/14; H04L 12/28; H03K 3/84; G06F 1/02

(52) U.S. Cl. .......................... 370/216; 370/244; 370/249; 370/352; 370/392; 370/515; 375/367; 704/226; 364/717.03

(58) Field of Search .................................... 370/216, 242, 370/244, 249, 250, 352, 389, 392, 428, 514, 515, 516; 331/78; 364/717.01, 717.03, 717.04, 717.07; 375/140, 354, 365, 367; 704/201, 211, 214, 215, 226, 229

(56) References Cited

U.S. PATENT DOCUMENTS 5,121,349 * 6/1992 Naito .................................... 364/717
5,153,532 * 10/1992 Albers et al. .......................... 331/78
5,592,587 * 1/1997 Kunoff et al. ...................... 395/2.73
5,754,603 * 5/1998 Thomas et al. ...................... 375/367
5,790,538 * 8/1998 Sugar .................................. 370/352
5,870,397 * 2/1999 Chauffour et al. .................. 370/435

* cited by examiner

*Primary Examiner*—Alpus H. Hsu
(74) *Attorney, Agent, or Firm*—McAndrews, Held & Malloy, Ltd.

(57) ABSTRACT

A method and apparatus for replacing lost PSTN data in a packet network and for generating variable power white noise are disclosed. In one embodiment, the method for replacing data includes the steps of receiving data packets, detecting lost data packets, and producing in response a lost data output indicating when replacement data needs to be provided. The method preferably generates the replacement data by re-using data stored in an extended playback buffer (with the re-used replacement data starting with the oldest output data byte stored in the extended playback buffer), and placing the re-used replacement data on an external network. Another aspect of the invention is a variable power white noise generator for providing replacement data. The variable power white noise generator may use, for example, a multi-bit register that stores a magnitude, and a pseudo-random sign bit generator to change the positive and negative sense of the magnitude. In one preferred embodiment, a linear feedback shift register (LFSR) is used in conjunction with a feedback network corresponding to a polynomial generating function. The pseudo-random output sequence of the LFSR then produces a pseudo-random output bit to control the positive and negative sense of the magnitude bits.

32 Claims, 2 Drawing Sheets

METHOD AND APPARATUS FOR REPLACING LOST PSTN DATA IN A PACKET NETWORK

STATEMENT REGARDING FEDERALLY SPONSORED RESEARCH OR DEVELOPMENT

Not applicable.

CROSS-REFERENCE TO RELATED APPLICATIONS

Not applicable.

BACKGROUND OF THE INVENTION

The present invention relates to replacement of data lost or corrupted in a packet network. In particular, the present invention relates to a method and apparatus using selectable replacement data generators to replace lost PSTN data in a packet network.

Modern communications networks carry staggering amounts of data generated by numerous and diverse information sources. The Public Switched Telephone Network (PSTN) (which is a Time Division Multiplex (TDM) communications network) carries, for example, digital data representing voice signals and digital data produced by faxes and MODEMs. Furthermore, the data may travel over any number of varied networks in route from the information source to the information destination, with each network incorporating divergent topologies and routing protocols.

Some networks divide data traffic into discrete packets which are referred to as "frames", "packets", or "cells", depending on the particular network. As an example, an Asynchronous Transfer Mode (ATM) network is one of the many network solutions currently available. An ATM network supports high speed data transfers by dividing the data into individual "cells". An ATM network cell is 53 bytes long and includes 48 information bytes and 5 network control bytes. It is often possible to link two or more dissimilar networks with an interworking device.

For example, an ATM network may accept, through an interworking device, a synchronous byte stream of digitized voice or MODEM data from a local PSTN or Public Branch Exchange (PBX) that may, for example, connect directly to a local loop and home telephone lines. The ATM network groups these bytes into cells, and routes the packetized data over high speed ATM links to a destination. At the destination, the ATM network interfaces, for example, with a PSTN through an interworking device. The interworking device accepts the asynchronous stream of packets and converts this data to a synchronous stream of bytes to be delivered to the PSTN network. An ATM to PBX interworking function may be provided, for example, by a Tellabs AN2100 multiplexer, available from Tellabs, Inc., Lisle Ill.

Many network protocols include provisions for determining when cells or packets are lost or corrupted. In ATM networks that carry cells created by the ATM Adaptation Layer 1 protocol (AAL1), for example, one of the information bytes is an information control byte that includes a 3-bit sequence number that is incremented each time a new cell is sent over the network. A receiver may then detect a missing cell by monitoring the sequence number. For example, receiving a sequence of cells 1,2,4,5 reveals that cell 3 has been lost.

In order to maintain bit count integrity in the PSTN network, a substitution function in the interworking device at the ATM network destination typically inserts dummy data in place of the missing cell. The amount of dummy data inserted is equal to the amount of data carried by the lost cell, for example, an ATM cell using AALI may carry 47 bytes of data. The substitution function typically takes one of three approaches to generating dummy data: inserting silence, inserting white noise, or inserting (repeating) previous data. The type of dummy data that the substitution function inserts is of particular importance when the dummy data is communicated out to the PSTN (and connected phone lines, fax machines, and MODEMs).

Inserting silence may be implemented by using a single, constant value as the dummy data for each byte in a lost or corrupted cell. The silence results because a series of constant values has a predominately DC (i.e., zero frequency) component. The DC component is filtered out by the CODECs (which typically roll off in frequency response below 300 Hz and above 3400 Hz, with severe attenuation at approximately 0 Hz or DC) that convert the PSTN data to analog form for reproduction at a telephone receiver.

Inserting silence often has undesirable effects when the series of constant values makes its way back out to the PSTN, however. For instance, if the dummy data forms part of a digitized voice conversation, the constant values manifests themselves as complete silence at a PSTN receiver. Complete silence makes a telephone call sound as if the line has gone dead or has otherwise been disconnected. Furthermore, if the dummy data forms part of a voiceband data connection (for a fax machine, for example), then complete silence may be interpreted as a disconnection or loss of carrier by a receiving fax machine. Thus a MODEM or fax machine may "drop out", i.e., drop a connection, or otherwise lose the ability to transmit or receive data on the connection when it receives inserted silence.

In the past, one method for repeating old data simply replayed a single piece of old data, for example, the last cell successfully received. Inserting a single cell of old data may cause audible false tones or frequency components, particularly if more than a few sequential cells are lost and the same old cell is repeated more than a few times.

Inserting white noise is a third option available to a substitution function. A generally accepted definition of white noise is that a white noise signal consists of samples whose values are uncorrelated with one another. In other words, the given sample value cannot be predicted with any additional accuracy even given a complete knowledge of all past and future samples. Noise substitution in general has been proposed, for example, in the American Nation Standards Institute (ANSI) T1 standard T1.312 of 1991. The T1 standard specifies a set of 16 noise power levels that should be used, but does not provide any method for generating noise of any type.

White noise substitution provides a sound similar to the background static sound familiar from periods of silence during phone conversations or loss of radio or television reception. The static sound reinforces the perception during a phone call, for example, that the connection is still intact (that the line has not gone dead). Ideal white noise produces energy in all frequency bands and MODEM and fax machines typically interpret a received signal with energy at a particular frequency with a predetermined range as a live connection. Thus, regardless of the particular frequency or frequency band in which a MODEM expects to find energy representing a live connection, that energy may be provided by white noise substitution. Inserting white noise with more than the threshold amount of energy therefore prevents, in many instances, MODEMs and fax machines from terminating a connection.

One past approach to generating white noise has centered around real-time speech coding. In J. F. Lynch Jr. et al., *Speech/Silence Segmentation for Real-Time Coding Via Rule Based Adaptive Endpoint Detection,* ICASSP '87, 1348–1351 (1987) (the "ICASSP paper"), the authors propose a general speech coding scheme. The coding scheme includes a receiver that reconstructs speech by decoding speech segments and that reconstructs silence with a noise substitution process controlled through amplitude and duration parameters. The noise substitution process in the ICASSP paper uses a 18th order polynomial to generate a spectrally flat pseudo-random bit sequence that is filtered to match the mean coloration of acoustical background noise.

The ICASSP paper proposes a set of production rules that generate a single scalar quantity called a noise metric that indicates the current level of background noise. At the receiver, a binary shift register produces a binary sequence that is modulated with the noise metric to produce noise at the amplitude of the original background noise. In addition, the modulated output is passed through a low pass filter to shape the simulated noise to approximate the average "coloration" of the background noise. The approach in the ICASSP paper thus does not provide an independent mechanism for manipulation of the output noise power level. Rather, the output noise amplitude is responsive to a mechanism that is required to generate a noise metric. Furthermore, the ICASSP paper requires an output low pass filter to further shape the output noise appropriately for merging with decoded speech segments.

A need exists in the industry for a method and apparatus for replacing lost PSTN data in a packet network, including flexible and efficient mechanisms for lost data substitution and white noise generation.

BRIEF SUMMARY OF THE INVENTION

It is an object of the present invention to provide a method and apparatus for replacing lost PSTN data in a packet network.

It is another object of the present invention to provide a lost data substitution method.

Yet another object of the present invention is to provide a lost data substitution method that uses an extended data buffer which provides replacement data and that minimizes false tones or spurious frequency components in the data communicated to the PSTN.

It is an object of the present invention to provide a variable power white noise generator for use with modern networking components.

It is another object of the present invention to provide a variable power white noise generator that provides direct control over the white noise output power.

A further object of the present invention is to use a linear feedback shift register in a lost data substitution device to provide a pseudo-random white noise output.

Another object of the present invention is to generate white noise at a power level suitable to maintain fax, MODEM, and data connections.

Another object of the present invention is to generate white noise at a power level suitable to indicate a live telephone connection.

A still further object of the present invention is to provide an interworking unit including multiple distinct data replacement generators, each of which may be selected according to a replacement data selection input.

The present invention provides a method and apparatus for replacing lost PSTN data in a packet network and for generating variable power white noise. In one embodiment, the method for replacing data includes the steps of receiving data packets, detecting lost data packets, and producing in response a lost data output indicating when replacement data needs to be provided.

The method may then generate replacement data by re-using data stored in an extended playback buffer (with the re-used replacement data starting with the oldest output data byte stored in the extended playback buffer), and placing the re-used replacement data on an external network when the lost data output indicates replacement data needs to be provided. Alternatively, other replacement data generators may provide the replacement data. For example, a variable power white noise generator or a silence generator may provide the replacement data.

Another aspect of the invention is a variable power white noise generator including, for example, a multi-bit register storing a magnitude, and a pseudo-random sign bit generator for changing the positive and negative sense of the magnitude. As one example, the multi-bit register may be implemented as an 8-bit register with one sign bit and seven magnitude bits to represent values from −127 to +127. Alternately, larger or smaller registers may be used as well as alternate predetermined number formats, for example, two's complement representation.

In one preferred embodiment, the variable power white noise generator uses a linear feedback shift register (LFSR) including n bit positions. The LFSR is connected to a feedback network which corresponds to a polynomial generating function. The generating function preferably produces a pseudo-random output sequence of length $2^n-1$. The pseudo-random output sequence of the LFSR may then provide the pseudo-random sign bit which controls the positive and negative sense of the magnitude bits. For example, the sign bit may be placed in a sign bit location in the multi-bit register or otherwise combined with the magnitude in downstream processing.

The output of the multi-bit register provides a white noise output of variable power by changing the value stored in the magnitude bits. The white noise output may then be used, for example, to fill in missing data in an output data stream and the power may be adjusted to a predetermined level for voice conversations and a second predetermined level for data communications, or for finer control, the power level may be determined adaptively for a particular connection. Several independent multi-bit registers or LFSRs may be provided to handle numerous independent output data streams.

DETAILED DESCRIPTION OF THE INVENTION

Figure 4:
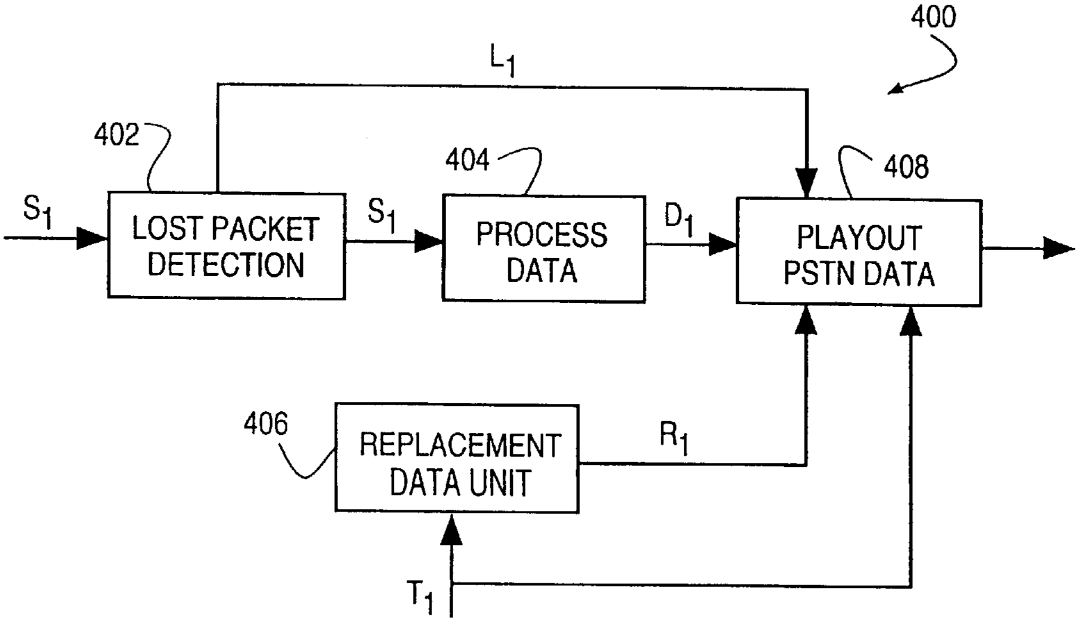
FIG. 4 shows a block diagram of an interworking unit including lost packet detection and replacement data generation functions.

Turning now to FIG. 4, that figure shows a block diagram of an interworking function 400. The interworking function 400 includes a lost packet detection unit 402 connected to a data processing unit 404. Also included is a replacement data unit 406 connected to a data playout unit 408. It is noted that one or more of the interworking blocks 402–408 shown in FIG. 4 may be implemented in a single ASIC, PLD, or the like, or alternatively with discrete circuitry, or software.

The lost packet detection unit 402 receives a packet stream $S_i$, (i.e., packet data for connection i), as an input. The lost packet detection unit 402 examines each packet in the stream $S_i$ to determine when packets are missing (for example, by checking sequence numbers), corrupted (for example, by checking error correcting codes), not available when needed (for example, by checking a received data queue size), or otherwise require substitution with replacement data. The lost packet unit 402 indicates when replacement data is needed by asserting or deasserting one or more signals $L_i$.

The packet stream $S_i$ is also connected to the data processing unit 404. In the data processing unit 404, packet overhead bytes are removed and the remaining data, $D_i$, is processed and forwarded to the data playout unit 408. The overhead bytes typically represent information such as sequence numbers (in ATM networks in particular), but may also include any overhead information added to a packet including error correcting codes, source/destination routing information, and the like.

When replacement data is not needed (as indicated by $L_i$), the data playout unit 408 places the data $D_i$ on the PSTN in particular time slots according to PSTN standards. It is noted, however, that the present invention is not limited to interworking with the PSTN. Rather, the interworking device 400 and data playout unit 408 may connect to virtually any destination network provided that the data playout unit 408 appropriately formats the data according to the standards for that destination network. When $L_i$ indicates that replacement data is needed, however, the data playout unit 408 places the replacement data $R_i$ on the PSTN instead of the data Di. The replacement data $R_i$ may be provided by the data replacement unit 406 or the data playout unit 408.

The data replacement unit 406 or the data playout unit 408 may include several distinct replacement data generators. For example, one replacement data generator may be implemented as an extended playback buffer, another replacement data generator may be implemented as a variable power white noise generator, and yet another replacement data generator may be a silence generator (each described in more detail below). The data replacement unit 406 may determine which replacement data generator to use based upon the $T_i$ input. An echo canceller may provide $T_i$ to indicate that connection i is a data connection (i.e., fax or MODEM), a voice connection, or another type of connection. Another example source for $T_i$ is an SS7 unit.

Figure 1:
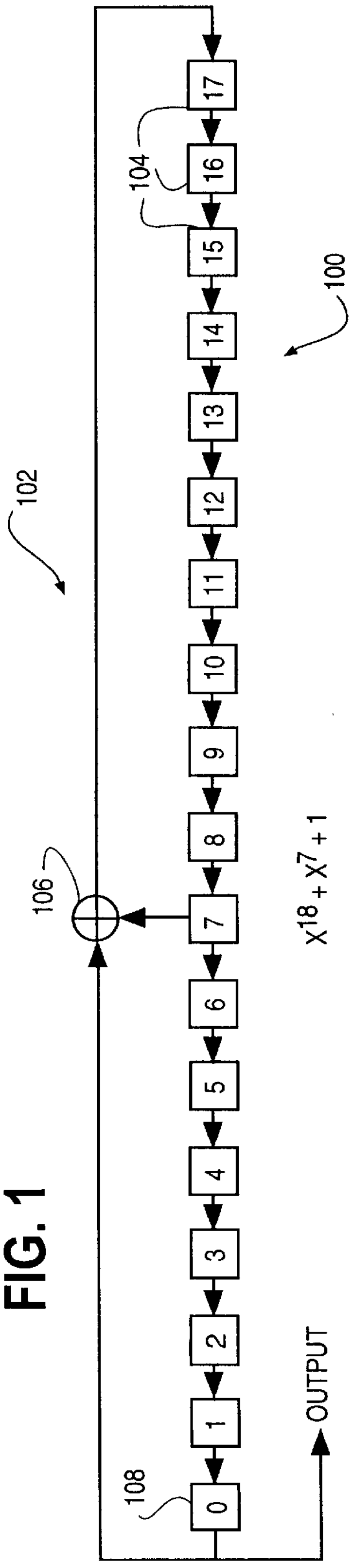
FIG. 1 illustrates one embodiment of a Linear Feedback Shift Register (LFSR) suitable for use in a variable power white noise generator.

As noted above, one of the distinct replacement data generators may be implemented as a variable power white noise generator, described in detail with reference to FIGS. 1 and 2. Turning first to FIG. 1, that figure shows a Linear Feedback Shift Register (LFSR) generally indicated 100. The LFSR 100 includes a feedback network 102 which corresponds to a generator polynomial and a series of registers 104 (register 0 through register 17). The feedback network 102 in FIG. 1 uses a summation node 106 that adds the contents of register 0 and register 7 and places the result in register 17. The bit stored in register 0 is used as the output bit 108.

The LFSR 100 in FIG. 1 includes 18 registers 104 and implements the generator polynomial $X^{18}+X^7+1$. In general, any generator polynomial of the form $G(X)=g_mX^m+g_{m-1}X^{m-1}+\ldots+g_1X+g_0$ may be implemented using additional summation nodes. As will be explained below, however, primitive polynomials are preferred. The LFSR 100 produces two output sequences. One sequence, of period one, is the output sequence of all zeros generated when the initial state of each of the registers 104 is zero. The other sequence produced by the LFSR 100 (generated from any starting condition other than all zeros) is of period $2^n-1$, where n is the number of registers 104.

The LFSR 100 and associated feedback network 102 produce a pseudo-random output of length $2^n-1$. Each new output is generated by evaluating the new contents for register 17 and shifting the contents of the registers 104 to the left. Because the LFSR 100 output will be used to fill cells of missing data which may represent telephone conversation samples, the length $2^n-1$ is preferably long enough to prevent the sequence from repeating at a rate that creates an audible frequency component in the telephone conversation. The rate of repetition, in turn, depends unpredictably on the number of cells or frames lost over a network. The value for n is therefore typically chosen heuristically. For example, a value for n of 18 is typically acceptable, though much smaller values may be used in networks less susceptible to lost frames and cells.

Figure 2:
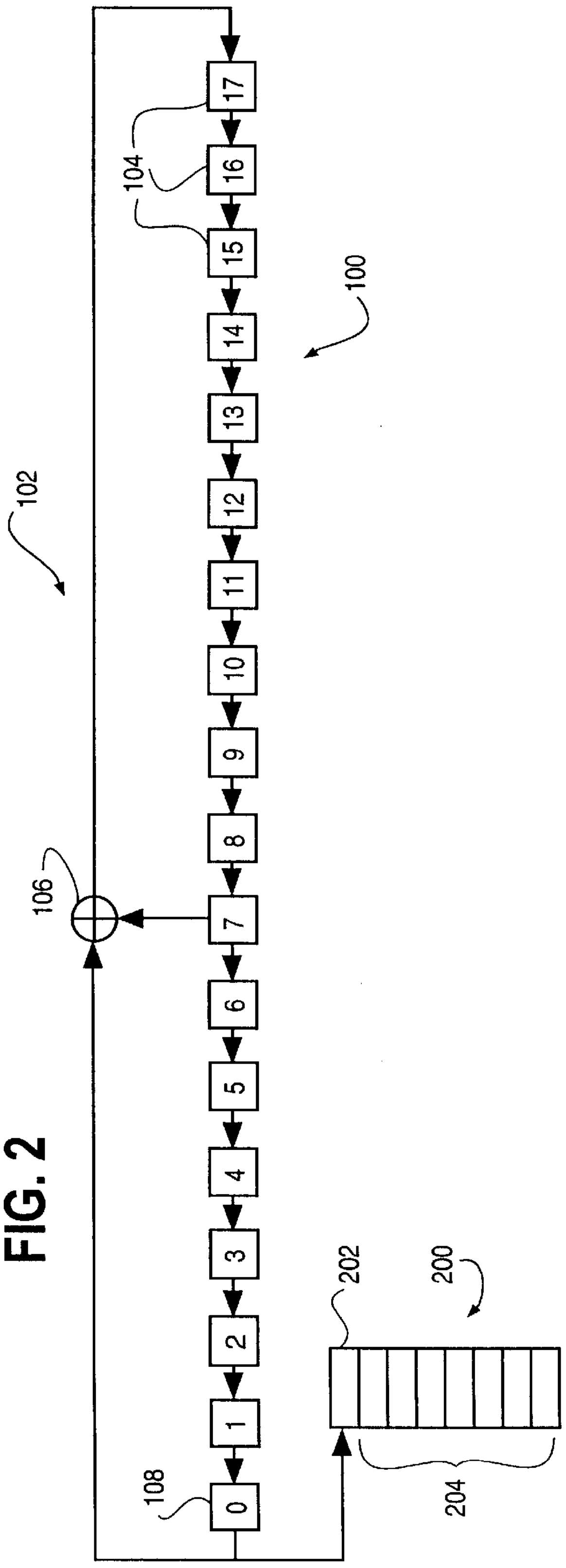
FIG. 2 shows an LFSR and multi-bit output register used to provide a variable power white noise output.

Turning now to FIG. 2, that figure shows the LFSR 100 connected to a multi-bit register 200. The multi-bit register 200 is shown including eight bits: a sign bit 202 and seven magnitude bits 204. The magnitude bits 204 may be connected to any general purpose data bus and provided with values between 0 and 127. If additional levels of magnitude are required, the multi-bit register 200 may be extended with additional magnitude bits. Similarly, the multi-bit register 200 may be shortened to reduce the number of magnitudes available. The multi-bit register 200 may store a sign magnitude (one's complement) binary value, for example, or may store a binary value in another predetermined format, including two's complement, A-law, or $\mu$-law.

The output bit 108 controls whether the magnitude represented by the magnitude bits 204 will be stored as a positive or negative (signed) quantity. Because the output bit 108 is generated by the pseudo-random output of the LFSR 100, the signed quantity fluctuates between positive and negative values in a pseudo-random, uncorrelated fashion. Thus, the contents of register 200 produce a pseudo-white noise signal whose power may be varied by modifying the contents of the magnitude bits 204. As described below, data connections (i.e., for faxes and MODEMs) are preferably maintained using an extended playback buffer. However, the magnitude bits 204 may be adjusted in accordance with $L_i$, for example, to provide a low level background white noise for a telephone conversation and to provide a high level background white noise to prevent a fax or MODEM from disconnecting a data connection.

For example, in the logarithmic $\mu$-law representation that is used in North America, the samples placed on the PSTN are 8 bit samples. When using a fixed magnitude value and randomly alternating the sign bit, the maximum power defined for this signal is approximately +3 dBm0, and the minimum non-zero power is approximately −69 dBm0. Typical fax and modem equipment determines that a signal power above approximately −42 dBm0 represents a live connection. The data representing a voice call typically resides at approximately −15 to −20 dBm0 and has a noise energy level below −40 dBm0. Thus, the magnitude bits 204 may be set within a range between −69 dBm0 and −40 dBm0 for a voice call. For a data call, the magnitude bits 204 may be set above a predetermined threshold, for example, −42 dBm0, or within a range, for example between −42 dBm0 and 0 dBm0.

As noted above, one of the distinct replacement data generators may be implemented as a silence generator. One efficient mechanism for generating silence uses the structure of the variable power white noise generator described above. In order to generate silence, the data replacement unit 406 ignores, makes constant, or provides a constant sign bit 202 with the magnitude bits 204. The result is a constant output value which depends on the magnitude bits 204. Silence results because a series of constant values has a predominately DC (i.e., zero frequency) component. The DC component is filtered out by the CODECs (which typically roll off in frequency response below 300 Hz and above 3400 Hz, with severe attenuation at approximately 0 Hz or DC) that convert the PSTN data to analog form for reproduction at a telephone receiver.

Yet another alternative replacement data generator may be implemented as an extended playback buffer. The playback buffer may store, for example, 512 bytes of previously correctly received packet data. The playback buffer may be flexibly located, and may be placed, for example, in the data replacement unit 406 or the data playout unit 408. Preferably, the playback buffer is located in the playout unit 408 because the extracted data $D_i$ to be stored in the playback buffer passes through the playout unit 408 in normal operation. Extra connections are therefore eliminated, for example, between the data extraction unit 404 and the replacement data unit 406.

The $L_i$ signal indicates when replacement data is to be provided by the extended playback buffer. As an example, the extended playback buffer may be used for data connections including fax and MODEM connections for example, as determined by an echo canceller. In response, the extended playback buffer preferably provides replacement data starting with the oldest data packet stored in the playback buffer and proceeding to the most recently stored data packet. Thus, there is no repetition of replacement data unless more bytes are lost than can be stored in the playback buffer. An extended playback buffer, for example, 512 bytes in length provides a much richer frequency representation (approximating the frequency content of the original signal) than past schemes which repeat a much smaller buffer, for example, one packet, over and over. The extended playback buffer also reduces the probability of introducing false frequencies for even extended losses of data.

Figure 3:
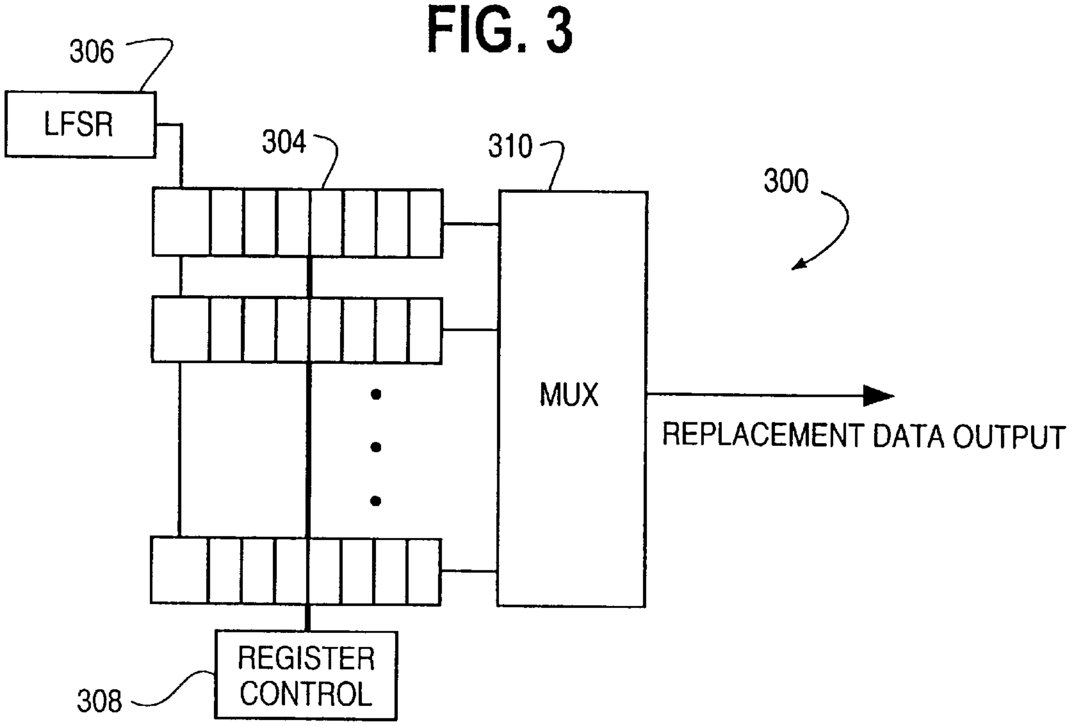
FIG. 3 shows one example of a bank of white noise generators used to provide independent variable power white noise outputs for multiple independent output data streams. Note that only one LFSR is needed for the entire bank of white noise generators.

Turning to FIG. 3, that figure shows one configuration 300 of variable power white noise generators used to provide replacement data for multiple independent connections. The configuration 300 includes a series of multi-bit registers 304 connected to an LFSR 306, a register control 308, and a multiplexer 310. The interworking components shown in FIG. 3 may, for example, be included in the data replacement unit 406.

As noted above, an interworking function provides a mechanism by which data is delivered to the destination PSTN from a dissimilar network (for example, an ATM network). As one example, the interworking function 400 may interface to a destination PSTN T1 line that carries multiple voice or data connections using 24 Time Division Multiplex time slots. Because data may be lost in the ATM network for any conversation that will be routed to the destination PSTN, the interworking function 400 may include a series of multi-bit registers 304 that replace the missing data for any time slot with white noise of power appropriate for the application using that time slot. Furthermore, the power output of the white noise generated by each multi-bit register 304 may be adjusted independently. Although FIG. 3 specifically shows an example of multiple variable power white noise generators, it is noted that multiple copies of each replacement data generator may be provided additionally or alternatively.

Thus, each register 304 may hold replacement data for a connection. The power level stored in each register 304 is preferably set for the duration of the connection. Additionally, each register, and therefore each connection, may be set to an independent power level by modifying the magnitude bits in each register.

A single LFSR 306 may provide the pseudo-random output controlling the positive and negative sense of each signed quantity stored in each of the multi-bit registers 304. Alternately, additional independent LFSRs may be connected to subsets of the multi-bit registers 304. In each instance where a frame or cell of data is missing, the multi-bit register 304 assigned to the outgoing time slot (coordinated by the multiplexer 310) may be used to generate white noise samples to replace the data in the missing frame or cell. The LFSR 306 may then be shifted (once for every byte of replacement data output) to produce a new pseudo-random output stored in the sign bit of each register 304. Missing cells are detected by the lost packet detection unit 402. The lost packet detection unit 402, as noted above, may function by monitoring sequence numbers of incoming frames or cells and detecting a missing sequence number or by other means.

The register controller 308 independently adjusts the magnitude portions of the multi-bit registers 304 and may function under general micro-controller and programmed control. As noted above, the magnitude of the multi-bit registers 304 may be adjusted, for example, depending on the desired output power level of the white noise. Adjustment typically occurs at call setup. One power level may be used for fax and MODEM calls, for example, while another power level may be used for voice data. Adjustment may occur after call setup, for example, based on measured signal values.

The determination of call type (e.g., fax or voice) may come from header and control information provided in previous frames or cells of data. In many instances, however, an echo canceller will be installed in or with the interworking equipment 300. The echo canceller very closely monitors the call data to determine the type of call and corresponding echo cancellation properties. Preferably, therefore, the echo canceller provides an output that indicates the call type during its normal course of operation.

A variety of techniques may be used to implement the LFSR 100 and multi-bit register 200. For example, flip flops, SRAM cells, or DRAM cells may form the basic building blocks for the LFSR 100 and multi-bit register 200. In addition, discrete logic, PLDs, or custom VLSI designs may be used to create the white noise generator of the present invention, including multiple LFSRs and multi-bit registers.

While particular elements, embodiments and applications of the present invention have been shown and described, it is understood that the invention is not limited thereto since modifications may be made by those skilled in the art, particularly in light of the foregoing teaching. It is therefore contemplated by the appended claims to cover such modifications as incorporate those features which come within the spirit and scope of the invention.

What is claimed is:

1. A method for generating variable power white noise for data replacement in a packet network, the method comprising:

storing a selected magnitude in a multi-bit register;

generating a pseudo-random sign bit using a linear feedback shift register; and providing the sign bit in conjunction with the magnitude as a pseudo-random variable power white noise output output value.

2. The method of claim 1, wherein the step of generating comprises evaluating register contents of the linear feed back shift register in a feedback network and shifting the contents of the linear feedback shift register.

3. The method of claim 2, wherein the step of evaluating register contents of the linear feed back shift register in a feedback network comprises evaluating register contents of the linear feed back shift register in a primitive polynomial feedback network.

4. The method of claim 1, wherein the step of storing a selected magnitude comprises storing a selected magnitude corresponding to an absolute energy level above a predetermined threshold for a data call.

5. The method of claim 4, further comprising the step of outputting the output value onto a destination network.

6. The method of claim 1, wherein the step of storing a selected magnitude comprises storing a selected magnitude corresponding to an absolute energy level within a predetermined range for a data call.

7. The method of claim 1, wherein the step of storing a selected magnitude comprises storing a selected magnitude corresponding to an absolute energy level within a predetermined range for a voice call.

8. The method of claim 7, further comprising the step of outputting the output value onto a destination network.

9. The method of claim 1, further comprising the step of outputting the output value onto a destination network.

10. A variable power white noise generator comprising:

a multi-bit register storing a signed quantity in a predetermined format representing a magnitude with a sign;

a linear feedback shift register connected to a sign bit in the multi-bit register, the linear feedback shift register including an output bit determining the sign of the magnitude;

a feedback network connected to the linear feedback shift register, the feedback network implementing a generator function; and a register control coupled to the multi-bit register that stores the magnitude in the multi-bit register.

11. The variable power white noise generator of claim 10, further comprising a lost packet detection unit including a lost data output.

12. The variable power white noise generator of claim 10, further comprising at least one additional multi-bit register storing a signed quantity in a predetermined format representing a magnitude with a sign, and wherein the linear feedback shift register is further connected to the sign bit of the additional multi-bit register to control the sign of the magnitude stored in the additional multi-bit register.

13. The variable power white noise generator of claim 12, further comprising a multiplexer for sequentially providing as output the signed quantity of each of the multi-bit registers.

14. The variable power white noise generator of claim 12, wherein the register control is coupled to each of the multi-bit registers for independently storing magnitudes therein.

15. The variable power white noise generator of claim 10, wherein the magnitude is greater than a predetermined data call threshold.

16. The variable power white noise generator of claim 15, wherein the data call threshold is approximately −42 dBm0.

17. The variable power white noise generator of claim 10, wherein the magnitude is greater than a predetermined voice call threshold.

18. The variable power white noise generator of claim 17, wherein the voice call threshold is greater than −69 dBm0 and the magnitude corresponds to less than −40 dBm0.

19. A method for replacing lost PSTN data in a packet network, the method comprising the steps of:

receiving data packets from the packet network;

detecting lost data packets and producing in response a lost data output indicating when replacement data needs to be provided;

removing overhead information from the data packets to produce output data;

storing a plurality of output data in an extended playback buffer;

generating duplicate replacement data using the extended playback buffer, the duplicate replacement data starting with the oldest output data stored in the extended playback buffer;

placing the duplicate replacement data on an external network when the lost data output indicates replacement data needs to be provided and placing the output data on the external network otherwise.

20. The method of claim 19, further comprising the steps of generating white noise replacement data using at least one variable power white noise generator, each variable power white noise generator producing the white noise replacement data by the steps of:

using a linear feedback shift register to control a sign bit of a multi-bit register;

storing a magnitude in the multi-bit register outputting the sign bit and magnitude as the white noise replacement data; and shifting contents of the linear feedback shift register; and wherein placing comprises placing on the external network one of the white noise replacement data and duplicate replacement data according to a replacement data selection signal.

21. The method of claim 20, further comprising the step of generating silence replacement data and wherein the placing step responds to the replacement data selection signal by placing white noise replacement data, duplicate replacement data, or silence replacement data on the external network.

22. The method of claim 20, wherein the magnitude is greater than a predetermined data call threshold.

23. The method of claim 22, wherein the data call threshold is approximately −42 dBm0.

24. The method of claim 20, wherein the magnitude is greater than a predetermined voice call threshold.

25. The method of claim 24, wherein the voice call threshold is greater than −69 dBm0 and the magnitude corresponds to less than −40 dBm0.

26. A method for replacing lost PSTN packet data in a packet network, the method comprising the steps of:

receiving data packets from the packet network;

detecting lost data packets and producing in response a lost data output indicating when replacement data needs to be provided;

removing overhead information from the data packets to produce output data;

generating white noise replacement data using a variable power white noise generator producing the white noise replacement data by the steps of:

using a linear feedback shift register to control a sign bit of a multi-bit register;

storing a magnitude in the multi-bit register;

outputting the sign bit and magnitude as the white noise replacement data; and shifting the contents of the linear feedback shift register; and placing the white noise replacement data on an external network when the lost data output indicates replacement data need to be provided and placing the output data on the external network otherwise.

27. The method of claim 26, further comprising the step of generating silence replacement data and wherein placing comprises placing one of the silence replacement data and the white noise replacement data on the external network in accordance with the replacement data selection signal.

28. The method of claim 26, wherein the magnitude is greater than a predetermined data call threshold.

29. The method of claim 26, wherein the magnitude is greater than a predetermined voice call threshold.

30. The method of claim 26, further comprising the step of multiplexing white noise replacement data from a plurality of variable power white noise generators onto the external network.

31. The method of claim 30, further comprising the step of using the linear feedback shift register to control a sign bit in each of the plurality of variable power white noise generators.

32. The method of claim 30, further comprising the step of independently storing magnitudes in each of the plurality of variable power white noise generators according to a call type for which each of the plurality of variable power white noise generators provides replacement data.

* * * * *